United States Patent [19]

Kitamura et al.

[11] Patent Number: 4,470,143
[45] Date of Patent: Sep. 4, 1984

[54] SEMICONDUCTOR LASER HAVING AN ETCHED MIRROR AND A NARROW STRIPE WIDTH, WITH AN INTEGRATED PHOTODETECTOR

[75] Inventors: Mitsuhiro Kitamura; Kohroh Kobayashi; Shigetoki Sugimoto, all of Tokyo, Japan

[73] Assignee: Nippon Electric Co., Ltd., Tokyo, Japan

[21] Appl. No.: 408,302

[22] Filed: Aug. 16, 1982

[30] Foreign Application Priority Data

| Aug. 18, 1981 | [JP] | Japan | 56-129057 |
| Oct. 29, 1981 | [JP] | Japan | 56-174323 |
| Nov. 9, 1981 | [JP] | Japan | 56-179303 |
| Nov. 12, 1981 | [JP] | Japan | 56-181618 |
| Nov. 13, 1981 | [JP] | Japan | 56-181853 |

[51] Int. Cl.$^3$ .............................................. H01S 3/19
[52] U.S. Cl. ........................................ 372/50; 357/19
[58] Field of Search .................... 372/50, 45, 46, 44; 357/17, 19; 250/211 J; 350/96.11

[56] References Cited

U.S. PATENT DOCUMENTS

| 4,136,928 | 1/1979 | Logan et al. | 350/96.11 |
| 4,274,104 | 6/1981 | Fang et al. | 357/19 |
| 4,275,404 | 6/1981 | Cassiday et al. | 357/19 |

OTHER PUBLICATIONS

Iga et al., "GaInAsP/InP Laser with Monolithically Integrated Monitoring Detector", *Electronics Letters*, vol. 15, No. 9, Apr. 24, 1980, pp. 342–343.

*Primary Examiner*—James W. Davie
*Attorney, Agent, or Firm*—Sughrue, Mion, Zinn, Macpeak and Seas

[57] ABSTRACT

In an integrated optical semiconductor device wherein a stripe geometry laser diode is separated from a photodetector by an etched groove, the stripe region has a smaller width, such as 2 to 3 microns, than a carrier generating region of the photodetector. The stripe region is preferably rendered thicker than the carrier generating region, in which case the carrier generating region is more preferably made of a seimconductor material having a narrower band gap than the material of the stripe region. The stripe region may be defined by a buried mesa structure. Alternatively, the stripe region may be bounded transversely of a pair of heterojunctions therefor by a pair of channel-shaped regions of a semiconductor material having a wider bank gap than the material of the stripe region. In this event, the carrier generating region is divided into three parts by extensions of the channel-shaped regions. Most preferably, the carrier generating region has a light receiving end which is not parallel to a light emitting end of the stripe region. The light receiving end may be cylindrical.

14 Claims, 16 Drawing Figures

SEMICONDUCTOR LASER HAVING AN ETCHED MIRROR AND A NARROW STRIPE WIDTH, WITH AN INTEGRATED PHOTODETECTOR

BACKGROUND OF THE INVENTION

This invention relates to an integrated optical semiconductor device. More particularly, this invention relates to a monolithic device comprising a multiple heterojunction laser diode of a stripe geometry structure and a photodetector on a common semiconductor substrate. The photodetector is for use in monitoring operation of the laser diode.

Recent semiconductor lasers have high performance and long life. Optical fibers have much been improved. As a result, optical fiber communication systems are stadily developed into practical use. This, in turn, has excited researches and development of integrated optical semiconductor devices in order to attain stable and yet inexpensive optical communication systems.

A semiconductor laser diode with an integrated photodetector is disclosed by K. Iga et al in a report in "Electronics Letters," Vol. 16, No. 9 (Apr. 24, 1980), pages 342-343, under the title of "GaInAsP/InP Laser with Monolithically Integrated Monitoring Detector." It has now been found as will later be discussed with reference to one of twelve figures of the accompanying drawing that it is difficult to manufacture such monolithically integrated semiconductor devices and to raise the photoelectric conversion efficiency of the photodetector and the reproducibility of manufacture and operation. It has also been found that such an integrated optical semiconductor device is not stably operable.

SUMMARY OF THE INVENTION

It is therefore a principal object of the present invention to provide an integrated optical semiconductor device which comprises a stripe geometry heterojunction laser diode and a photodetector and which is readily manufactured.

It is another principal object of this invention to provide an integrated optical semiconductor device of the type described, which has a high optoelectric conversion efficiency.

It is still another principal object of this invention to provide an integrated optical semiconductor device of the type described, which is manufactured and put into operation with high reproducibility.

It is a subordinate object of this invention to provide an integrated optical semiconductor device of the type described, which is stably operable.

It is possible to specify that an integrated optical semiconductor device to which this invention is applicable, comprises a stripe geometry heterojunction laser diode integrated with a photodetector on a semiconductor substrate and separated from the photodetector by an etched groove defining first and second etched surfaces. The laser diode has the first etched surface as one of a pair of mirror surfaces and comprises a stripe region which is bounded by a pair of heterojunctions, has a light emitting end on the first etched surface and a stripe axis, and is made of a semiconductor material having a first band gap. The photodetector has the second etched surface and comprises a carrier generating region which is bounded by a pair of heterojunctions disposed parallel to the heterojunctions of the stripe region, has a light receiving end on the second etched surface and a region axis substantially coaxially of the stripe axis, and is made of a semiconductor material having a second band gap.

According to this invention, the above-specified optical semiconductor device is characterised in that the second band gap is not wider than the first band gap and that the light receiving end has a wider area than the light emitting end.

Figure 1:
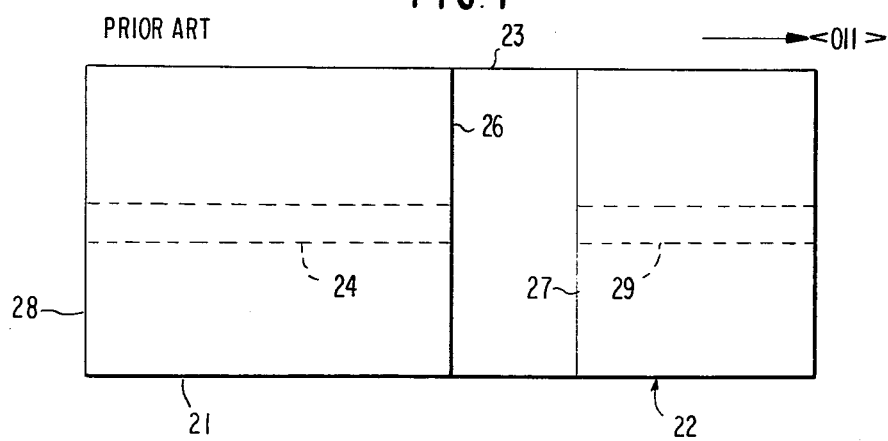
FIG. 1 is a top view of a conventional stripe geometry heterojunction laser diode integrated with a photodetector.

DESCRIPTION OF THE PREFERRED EMBODIMENTS:

Referring to FIG. 1, a conventional integrated optical semiconductor device will be described at first in order to facilitate an understanding of the present invention. The semiconductor device is of the type revealed in the Iga et at report referred to hereinabove and comprises a stripe geometry heterojunction laser diode 21 and a photodetector 22 which are monolithically integrated on a semiconductor substrate. A chemically etched groove separates the laser diode 21 from the photodetector 22 and exposes an area of the semiconductor substrate as indicated at 23. The laser diode 21 comprises a stripe or active region 24 having a stripe axis and bounded by a pair of heterojunctions which are parallel to the stripe axis and disposed parallel to the plane of the figure as will become clear as the description proceeds. The groove defines first and second etched surfaces 26 and 27.

The laser diode 21 has the first etched surface 26 as one of a pair of mirror or reflector surfaces. The first etched surface 26 is often called an etched mirror in the art. The other mirror surface is given by a cleaved facet 28 of the monolithic semiconductor crystal. The stripe region 24 has first and second light emitting ends on the first etched surface 26 and on the cleaved facet 28, respectively.

The photodetector 22 has the second etched surface 27 and comprises a carrier generating region 29 which is a substantial extension of the stripe region 24. More particularly, the carrier generating region 29 has a region axis substantially coaxially of the stripe axis and is bounded by extensions of the heterojunctions of the stripe region 24. In other words, the carrier generating region 29 is bounded by a pair of heterojunctions which are substantially coplanar with the heterojunctions of the laser diode 21. The carrier generating region 29 has a light receiving end on the second etched surface 27 as will shortly become clear.

By way of example, the stripe region 24 and the carrier generating region 29 are made of a known gallium-indium-arsenide-phosphide (GaInAsP) semiconductor material and bounded by layers of an indium-phosphide (InP) semiconductor material. The stripe region 24 and the carrier generating region 29 have their respective axes in the <011> direction or orientation of the semiconductor monolithic crystal. A groove axis bisecting the space between the first and the second etched surfaces 26 and 27, runs in the <01$\bar{1}$> direction. Each of the stripe region 24 and the carrier generating region 29 has a stripe width of about 15 microns in the direction of the groove axis. The stripe region 24 has a length, generally called a resonator length, of about 200 microns along the stripe axis. The carrier generating region 29 is about 100 microns long along the region axis. The groove has a width of about 30 microns between the first and the second etched surfaces 26 and 27 and a depth of several microns.

In operation, a positive bias is supplied to the laser diode 21 so as to give rise to carrier injection into the stripe region 24. When the current density of the carrier injection reaches a threshold current density, laser oscillation takes place in the stripe region 24 between the mirror surfaces. The laser diode 21 thereby emits laser beams or optical outputs through the first and the second light emitting ends, respectively. A negative bias is supplied to the photodetector 22. The optical output directed through the first light emitting end towards the photodetector 22 is received at the light recieving end and generates carriers in the carrier generating region 29. The photodetector 22 is thus used in monitoring operation of the laser diode 21.

When the depth of etch is of the order of several microns as described heretobefore, it is inevitable that the first etched surface 26 has small undulations of one or two microns. Having a stripe width of about 15 microns, operation of the laser diode 21 is adversely affected by the undulation. For example, the injection current versus optical output characteristics of the laser diode 21 are considerably nonlinear as compared with a cleaved facet laser diode having a pair of cleaved facets as the mirror surface pair. The threshold current density becomes dozens of percent higher than the cleaved facet laser diode. It is not seldom that the laser diode 21 would not generate laser oscillation. In other words, it is difficult to manufacture the semiconductor device and to raise the reproducibility and the yield of manufacture. In addition, not all the optical output emitted through the first light emitting end is received by the light receiving end to be used in generating the carriers in the carrier generating region 29. The optoelectric conversion efficiency is consequently not high.

Figure 2:
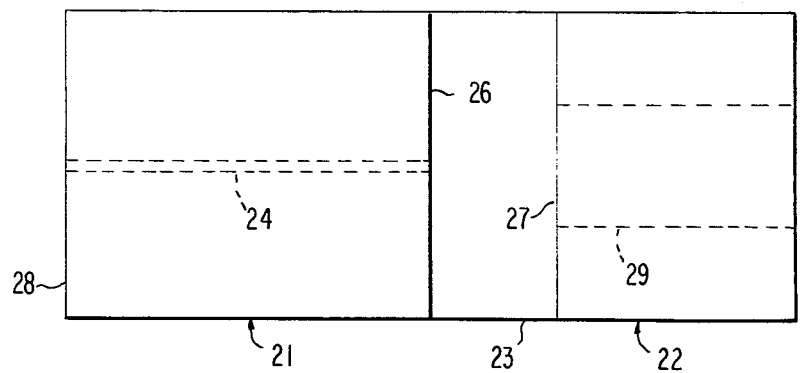
FIG. 2 is a top view of an integrated optical semiconductor device according to a first embodiment of the instant invention.

Referring now to FIG. 2, an integrated optical semiconductor device according to a first embodiment of this invention comprises similar parts designated by like reference numerals. The stripe region 24 of the stripe geometry heterojunction laser diode 21 is made of a semiconductor material, of which the carrier generating region 29 of the photodetector 22 is also made. The heterojunctions of the stripe region 24 are substantially coplanar with the heterojunctions of the carrier generating region 29. On the first etched surface 26, the stripe region 24 has a first light emitting end which has a smaller dimension or width than the light receiving end of the carrier generating region 29 in a direction parallel to the heterojunctions of the stripe region 24 and of the carrier generating region 29, namely, in the <01$\bar{1}$> direction. It is preferred that the dimension of the light emitting end is about 2 to 3 microns and that the dimension of the light receiving end is about 50 to 100 microns.

It has been confirmed that the narrow stripe width of the stripe region 24 removes the adverse effects of the undulation and renders it possible to readily etch the groove, thereby facilitating manufacture of such integrated optical semiconductor devices, and to raise the reproducibility of manufacture and operation and the yield and that the above-exemplified width of the carrier generating region 29 is sufficient to make the light receiving end receive most of the optical output emitted through the first light emitting end. The optical output thus received at the light receiving end, is effectively used in generating the carriers in the carrier generating region 29 to raise the photoelectric conversion efficiency.

It may be mentioned here that the groove may be formed by a known acid etchant of the composition HCl:CH$_3$COOH:H$_2$O$_2$=1:2:1. The acid etchant is repeatedly used at 15° C., each time followed by linsing and drying. Another known etchant is a bromine-methanol etchant, which is obtained by dissolving 0.3 cc. of bromine in 100 cc. of methanol. By the use of a silicon dioxide (SiO$_2$) etching mask, the groove is formed at 3° C. in two minutes. Alternatively, the groove may be formed by plasma etching or reactive ion etching rather than by the wet chemical etching.

Figure 3:
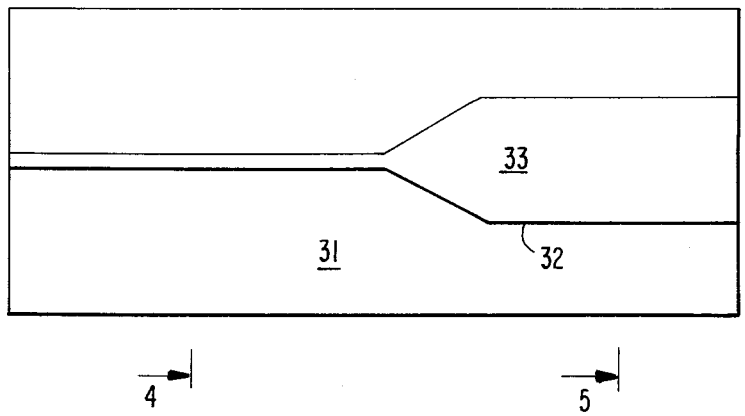
FIG. 3 shows a top view of a semiconductor device during manufacture of the semiconductor device depicted in FIG. 2.
Figure 4A:
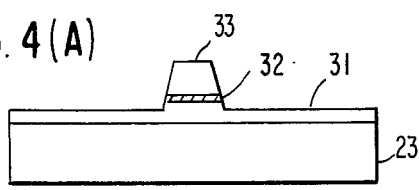
FIG. 4 schematically shows a few vertical sections taken along a line 4—4 of FIG. 3.
Figure 5A:
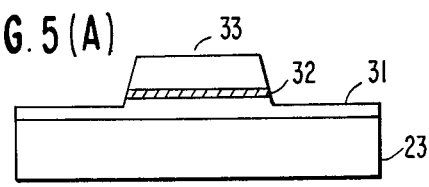
FIG. 5 schematically shows a few vertical sections taken along a line 5—5 of FIG. 3.

Referring to FIGS. 3, 4(A), and 5(A), the semiconductor device illustrated with reference to FIG. 2 is manufactured with the laser diode 21 implemented as a buried heterojunction laser diode and with the substrate 23 given by a piece of n-type indium-phosphide having a (100) surface. By resorting to liquid phase epitaxy (LPE), a double heterojunction (DH) wafer is manufactured at first.

At the outset, an n-type indium-phosphide buffer or base layer 31 is formed on the semiconductor substrate 23. Next, a gallium-indium-arsenic-phosphide layer 32 is formed on the buffer layer 31. As will presently become clear, the layer 32 serves as the stripe region 24 and also as the carrier generating region 29. The layer 32 will therefore be referred to as an operative layer. A p-type indium-phosphide clad layer 33 is thereafter formed on the operative layer 32 to accomplish the double heterojunction wafer. Merely for clarity of illustration, the operative layer 32 alone is hatched.

By resorting to the routine photoresist technique, the double heterojunction wafer is selectively etched as by the bromine-methanol etchent. The selective etch should reach the buffer layer 31 to leave a mesa thereon and to expose areas of the buffer layer 31 on both sides of the mesa. The mesa is long in the <011> direction. As best shown in FIG. 3, the operative layer 32 has a narrow width of 2 to 3 microns in the mesa and a broad width of about 100 microns at portions illustrated in FIGS. 4(A) and 5(A), respectively. It is to be noted that the mesa has a pair of side surfaces which are not parallel to the <011> direction.

Figure 4B:
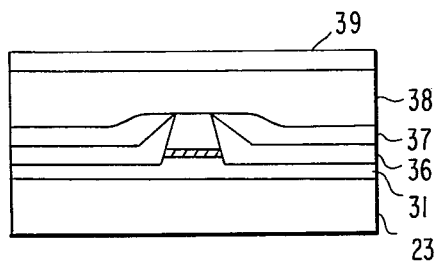
Figure 5B:
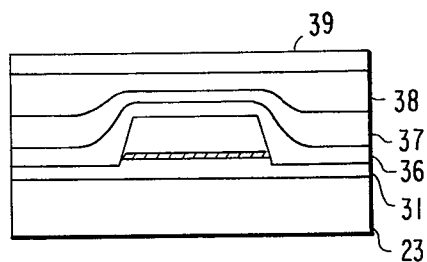

Turning to FIGS. 4(B) and 5(B), the liquid phase epitaxy is again carried out to provide a buried mesa structure. At first, a p-type indium-phosphide current blocking layer 36 is formed on the mesa and the exposed areas of the buffer layer 31. In the second place, an n-type indium-phosphide current blocking layer 37 is formed on the p-type current blocking layer 36. It has already been disclosed in U.S. patent application Ser. No. 252,773 filed Apr. 10, 1981, by Ikuo Mito et al and assigned to the present assignee, that the p-type and the n-type current blocking layers 36 and 37 can be formed except on the mesa of the narrow width of 2 to 3 microns as illustrated in FIG. 4(B). The p-type and the n-type current blocking layers 36 and 37 may be formed on the mesa of the broad width of 100 microns as depicted in FIG. 5(B).

In the third place, a p-type indium-phosphide burying layer 38 is formed on the n-type current blocking layer 37. The p-type burying layer 38 is in direct contact with the p-type clad layer 33 on the mesa of the narrow width as depicted in FIG. 4(B). An n-type electrode layer 39 of indium-phosphide is subsequently formed on the burying layer 38.

Figure 4C:
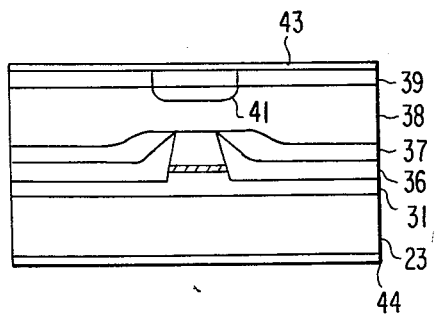
Figure 5C:
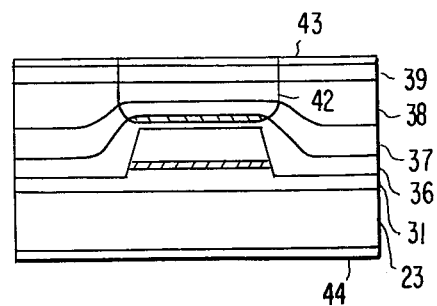

Further turning to FIGS. 4(C) and 5(C), zinc is selectively diffused as a p-type impurity into the buried mesa structure through the electrode layer 39. The selective diffusion is carried out by the use of a mask of a pattern used in the selective etching of the double heterojunction wafer. As indicated at 41, the zinc diffusion should have a diffusion front in the p-type burying layer 38 at the portion which will later serve as the laser diode 21. At the other portion which will later become the photodetector 22, the zinc diffusion should extend through the n-type current blocking layer 37 and not reach the operative layer 32 as shown at 42. It is readily possible to provide such zinc diffused regions 41 and 42 either by separately diffusing the zinc into the narrow and the broad mesa portions or by diffusing the zinc in two stages at the broad mesa portion. For convenience of illustration, the zinc diffused regions 41 and 42 are hatched.

Subsequently, a first ohmic electrode 43 is formed on the electrode layer 39 by gold-zinc (AuZn). The semiconductor substrate 23 is subjected to grinding so that the electrode-formed buried mesa structure be about 100 microns thick. A second ohmic electrode 44 is formed of gold-tin (AuSn) on the ground surface of the semiconductor substrate 23.

Figure 6:
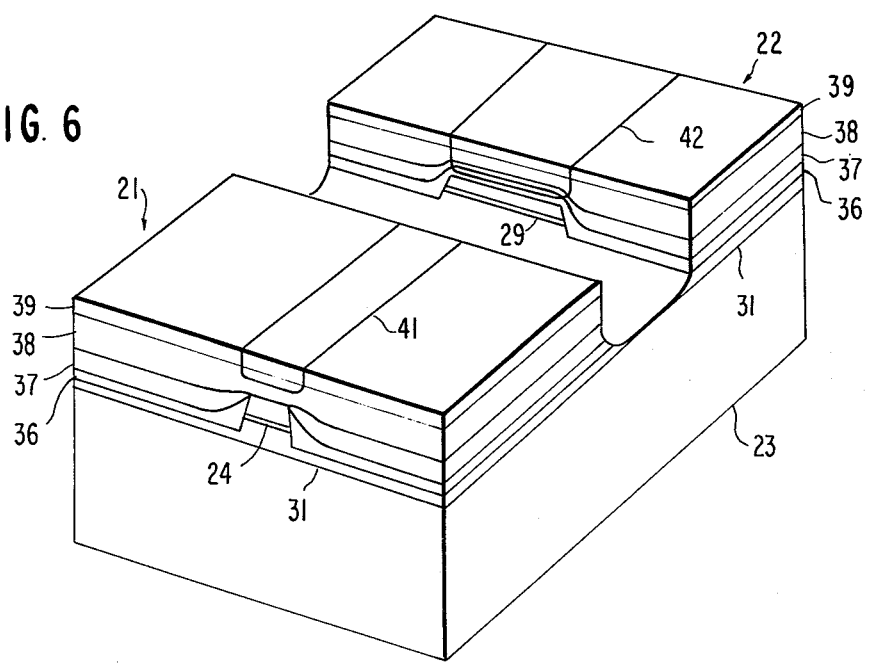
FIG. 6 shows a perspective view of the semiconductor device illustrated in FIG. 2, with electrodes removed.

Turning back to FIG. 2 and referring anew to FIG. 6, a groove is chemically or otherwise etched into the buried mesa structure. For this purpose, the epi-side of the buried mesa structure may be coated with a silicon dioxide film (not shown) by resorting to the known chemical vapor deposition technique (CVD). By the usual photoresist technique, an etching stripe (not shown) is formed. The etching stripe is long in the <01$\bar{1}$> direction and has a width of about 30 microns in the <011> direction. The electrodes 43 and 44 are not depicted in FIG. 6 merely for convenience of illustration.

On forming the groove, the first ohmic electrode 43 is etched at first by the use of a solution of iodine in potassium iodide. Next, the silicon dioxide film is used as a mask for etching the buried mesa structure to form the groove. Inasmuch as the etching in the <01$\bar{1}$> direction is the forward mesa etching, it is difficult to render the etched surfaces 26 and 27 perpendicular to the principal surface of the electrode-formed buried mesa structure. It is nevertheless possible by the use of the mask formed by the chemical vapor deposition technique to render the light emitting end parallel on the first etched surface 26 to the cleaved facet 28. As described, the groove separates the photodetector 22 from the laser diode 21. The zinc diffused regions 41 and 42 become electrode stripes of the laser diode 21 and of the photodetector 22, respectively.

It is known in such a buried heterojunction laser doide 21 that the stripe region 24 should have a band gap smaller than the surrounding which comprises the n-type buffer layer 31, the p-type clad layer 33, and the p-type current blocking layer 36. The stripe region 24 has an accordingly greater dielectric constant and refractive index than the surrounding. Materials for the semiconductor substrate 23 and the various layers 31 through 33 and 36 through 39 will later be discussed. It is also known that the photodetector 22 manufactured as above, is a pn-junction photodiode. The laser diode 21 being exemplified, generates laser oscillation in the 1-micron wavelength band.

As has already been pointed out heretobefore, the narrow stripe width of the stripe region 24 facilitates etching for the groove no matter whichever of the wet chemical etching, the plasma etching, the reactive ion etching, and the like is resorted to. This makes it possible to readily manufacture such intagrated optical semiconductor devices and to raise the yield of manufacture. In addition, the photodetector 22 is given a high optoelectric conversion efficiency. It is furthermore possible to raise the reproducibility of manufacture and also of the lasing and the photoelectric conversion characteristics.

When the conductivity types of the semiconductor substrate 23 and the semiconductor layers 31 through 33 and 36 through 39 are as exemplified above, the laser diode 21 and the photodetector 22 are supplied for operation with a positive and a negative bias, respectively, as is the case with the conventional device illustrated with reference to FIG. 1. The positive bias is applied across the stripe region 24 through the electrode stripe 41 of the laser diode 21 and the p-type burying and clad layers 36 and 33 on the one hand and through the semiconductor substrate 23 and the n-type buffer layer 31 on the other hand. Electric currents are blocked in the laser diode 21 at portions other than the stripe region 24, by the reversed bias developed at the junction between the n-type and the p-type current blocking layers 37 and 36 and also at that portion of the junction between the n-type electrode layer 39 and the p-type burying layer 38 through which the electrode stripe 41 does not pass. It has been confirmed that the semiconductor device illustrated with reference to FIGS. 2 through 6 is excellently operable.

Figure 7:
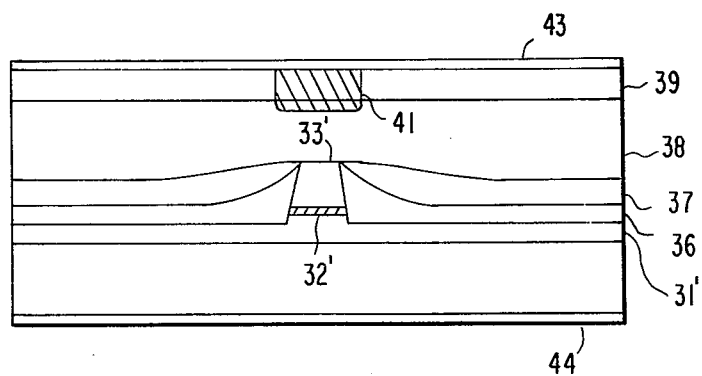
FIG. 7 is a vertical sectional view, similar to those shown in FIG. 4, of an integrated optical semiconductor device according to a second embodiment of this invention.
Figure 8:
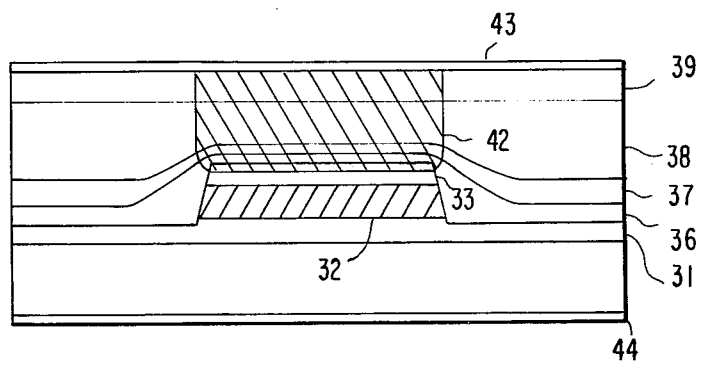
FIG. 8 is another vertical sectional view, similar to those illustrated in FIG. 5, of the semiconductor device shown in FIG. 7.

Referring now to FIGS. 7 and 8, an integrated optical semiconductor device according to a second embodiment of this invention is similar in structure to that described with reference to FIGS. 2 through 6 and will be described by the use of like reference numerals. The semiconductor device being illustrated, however, comprises a carrier generating region 29 which is wider as well as thicker than the stripe region 24. This further raises the optoelectric conversion efficiency of the photodetector 22.

The carrier generating region 29 is preferably made of a semiconductor material having a narrower band gap than the semiconductor material of which the stripe region 24 is made. In this event, the double heterojunction wafer is manufactured by carrying out the liquid phase epitaxy in two steps for the portions which will later become the laser diode 21 and the photodetector 22, with an etching step interposed between the two liquid phase epitaxy steps. As described in U.S. Pat. No. 4,318,058 issued to Ikuo Mito el al and assigned to the instant assignee, the wavelength of the laser oscillation monotonously depends on the band gap in a certain range of the mixture ratio of a semiconductor material of a ternary or a quaternary system. The narrower band gap of the carrier generating region 29 favorably contributes to the optoelectric conversion efficiency. The band gaps in the stripe region 24 and in the carrier generating region 29 will be named first and second band gaps, respectively. It may be mentioned here in this connection that the first and the second band gaps are equal to each other both in the conventional device and in the semiconductor device illustrated with reference to FIGS. 2 through 6.

Referring more particularly to FIG. 8 at first, a first n-type indium-phosphide buffer layer 31 is formed on the n-type indium-phosphide semiconductor substrate 23 at the outset of the liquid phase epitaxy of the first step. Next, a first operative layer 32 of non-doped indium-gallium-arsenide-phosphide (InGaAsP) is formed on the first buffer layer 31 to a thickness of 2 microns. Thirdly, a first n-type indium-phosphide clad layer 33 is formed on the first operative layer 32. The semiconductor layers 31 through 33 may extend throughout the whole length of the semiconductor substrate 23 in the <011> direction. Subsequently, the first clad and operative layers 33 and 32 are etched away selectively, together with at least a thickness of the first buffer layer 31 so as to form an indent at a portion where the laser diode 21 should be formed. The indent has a bottom surface either in the first buffer layer 31 or in the semiconductor substrate 23.

Referring back to FIG. 7 more specifically, a second n-type indium-phosphide buffer layer 31' is formed at first during the second-step liquid phase epitaxy on the bottom surface of the indent so that the second buffer layer 31' may have an exposed surface a little higher in the figure than a heterojunction formed between the first buffer and operative layers 31 and 32. In the second place, a second operative layer 32' of indium-gallium-arsenic-phosphide is formed on the second buffer layer 31' to a thickness of 0.2 micron. The semiconductor material of the second operative layer 32' preferably has a wider band gap than the material of the first operative layer 32. Preferably, the formerly exposed surface of the second buffer layer 31' is on a level such that the subsequently formed second operative layer 32' may bisect the first operative layer 32. In the third place, a second p-type indium-phosphide clad layer 33' is formed on the second operative layer 32'.

Reviewing FIGS. 7 and 8, the double heterojunction wafer is etched as described in connection with FIGS. 4(A) and 5(A) to provide a mesa having a narrow and a broad width at portions where the laser diode 21 and the photodetector 22 are later formed, respectively. The p-type and the n-type indium-phosphide current blocking layers 36 and 37 and the p-type indium-phosphide burying layer 38 are successively formed on the mesa and the exposed surfaces of the first and the second buffer layers 31 and 31'. In the illustrated example, the electrode layer 39 is made of n-type indium-gallium-arsenic-phosphorus.

The electrode stripes 41 and 42, the ohmic electrodes 43 and 44, and the etched groove are formed as in the semiconductor device described in conjunction with FIGS. 2 through 6. It has been confirmed that the semiconductor device illustrated with reference to FIGS. 7 and 8 is excellently operable.

When distinctly set forth, the semiconductor device illustrated with reference to FIGS. 7 and 8 comprises a buried heterojunction laser diode 21 and a pn-junction photodiode 22 wherein the heterojunctions of the carrier generating region 29 are parallel to the heterojunctions of the stripe region 24. The former heterojunctions have a greater distance therebetween than the latter heterojunctions. The light emitting end has a smaller dimension or width on the first etched surface 26 than the light receiving end in a direction parallel to the heterojunctions of the stripe region 24 and of the carrier generating region 29.

Figure 9:
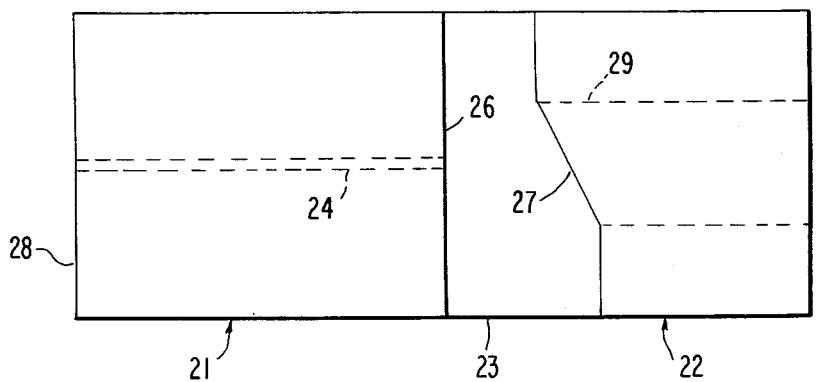
FIG. 9 is a top view of an integrated optical semiconductor device according to a third embodiment of this invention.

Referring now to FIG. 9, an integrated optical semiconductor device according to a third embodiment of this invention is similar in structure to that described in conjunction with FIGS. 2 through 6. On separating the buried heterojunction laser diode 21 and the pn-junction photodiode 22 from each other, the first etched surface 26 of the etched groove is formed parallel to the <01$\bar{1}$> direction as before. In contrast, the groove is formed so that the second etched surface 27 is not parallel to the first etched surface 26 at least at that portion thereof which includes the light receiving end and extends therefrom perpendicularly of the heterojunctions in the <100> direction.

It is well known in the art that the semiconductor laser diode 21 is adversely affected as regards the modes of laser oscillation when the active region, such as the stripe region 24, is subjected to rays incident thereinto from outside. More particularly, the optical output is directed to an incident end of an optical fiber through the above-mentioned second light emitting end. The optical output is reflected at the incident surface to be fed back to the stripe region 24 through the second light emitting end as rays from the outside. Such rays serve as feedback noise. The optical output taken out of the first light emitting end is likewise reflected by the second etched surface 27. Inasmuch as such reflected rays come from that area of the second etched surface 27 which includes the light receiving end, the inclined part of the second etched surface 27 effectively prevents the laser beam from being fed back to the first light emitting end. It has been confirmed that the transverse and the axial modes of the laser oscillation are effectevely stabilized.

Figure 10:
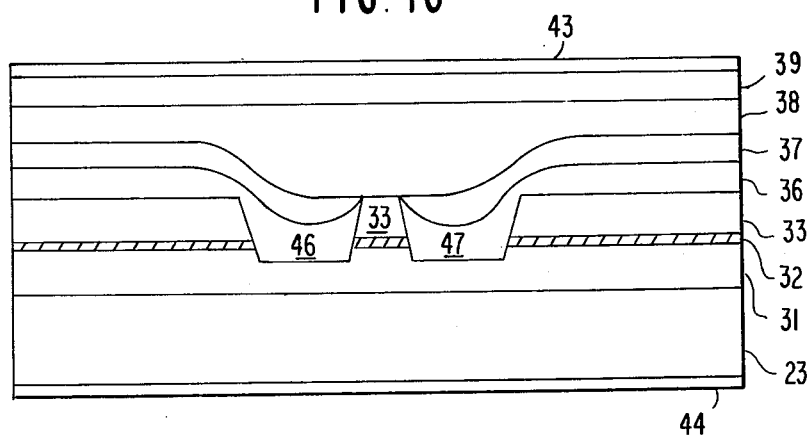
FIG. 10 is a vertical sectional view, similar to those illustrated in FIG. 4, of an integrated optical semiconductor device according to a fourth embodiment of this invention.
Figure 11:
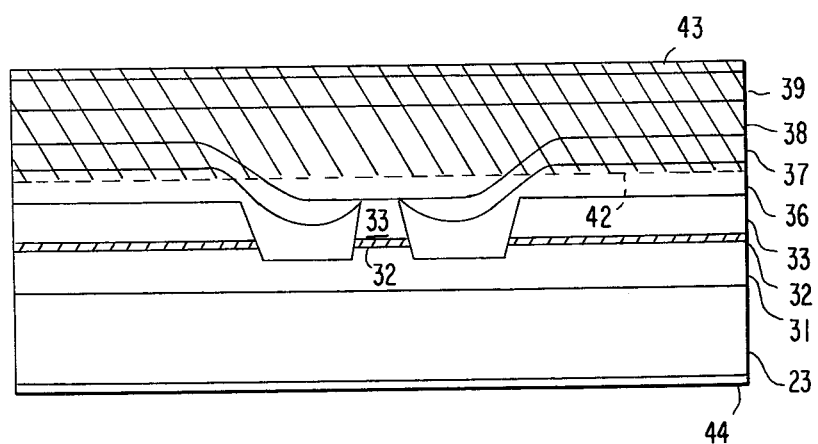
FIG. 11 is another vertical sectional view, similar to those shown in FIG. 5, of the semiconductor device depicted in FIG. 10.

Referring to FIGS. 10 and 11, an integrated optical semiconductor device according to a fourth embodiment of this invention comprises similar parts designated by like reference numerals. In the laser diode 21, the stripe region 24 is bounded by a pair of channel-shaped semiconductor regions 46 and 47 which have a common band gap wider than the band gap of the semiconductor material of the stripe region 24. Each of the wider band gap regions 46 and 47 extends lengthwise between the mirror surfaces 26 and 28 (FIG. 2) of the laser diode 21 and between the heterojunctions by which the stripe region 24 is bounded. The photodetector 22 comprises extensions of the wider band gap regions 46 and 47. Each of the extensions has an end on the second etched surface 27 (FIG. 2). The light receiving end of the carrier generating region 29 is divided by the ends of the extensions into three parts.

It is to be noted that the operative layer 32 is also divided by the wider band gap regions 46 and 47 into three parts between and on both outsides of the wide band gap regions 46 and 47.

Referring more particularly to FIGS. 10 and 11, a double heterojunction wafer is manufactured at first as described in conjunction with FIGS. 4(A) and 5(A). By way of example, the operative layer 32 is made of $In_{0.72}Ga_{0.28}As_{0.61}P_{0.39}$. The stripe region 24 of this composition generates laser oscillation at a wavelength of 1.3 microns.

Instead of being subjected to the mesa etching, the double heterojunction wafer is etched so that a pair of channels are formed lengthwise of the $<011>$ direction. The channels should have bottoms in the n-type buffer layer 31, with a 2-micron wide central part of the operative layer 32 interposed. Each of the channels may be 5 microns wide and 2 microns deep. Both outside parts of the operative layer 32 are left transversely outwardly of the respective channels. The p-type clad layer 33 is also divided into three parts, with the central part interposed between the channels and two outside parts left sidewards outwardly of the respective channels. It will presently become clear that the central part of the operative layer 32 becomes the stripe region 24 in the laser diode 21 with both outside parts left quiescent and that the three parts are for cooperation with one another in the photodetector 22 as the carrier generating region 29.

After the channel pair etching, the p-type indium-phosphide current blocking layer 36 is formed on the remaining parts of the p-type clad layer 33 and into the channels. The n-type indium-phosphide current blocking layer 37 is subsequently formed on the p-type current blocking layer 36. As pointed out in connection with FIGS. 4(B) and 5(B), it is possible to avoid formation of the p-type and the n-type current blocking layers 36 and 37 on the central part of the p-type clad layer 33 left between the channels with as narrow a width as 2 microns. The p-type current blocking layer 36 is therefore divided into two layer portions by the central part of the clad layer 33. The above-mentioned channel-shaped or wide band gap regions 46 and 47 are those parts of the two portions of the p-type current blocking layer 36 which are contiguous to the central part of the clad layer 33. The n-type current blocking layer 37 is likewise divided into two layer portions.

The p-type indium-phosphide burying layer 38 is formed on the central part of the p-type clad layer 33 and also on the two portions of the n-type current blocking layer 37. The electrode layer 39 may be made of p-type $In_{0.85}Ga_{0.15}As_{0.33}P_{0.67}$ which is capable of generating laser oscillation at a wavelength of 1.1 microns if the electrode layer 39 were used as an active region ending at a pair of mirror surfaces. Inasmuch as the electrode layer 39 is of the p-type conductivity, the electrode stripe 41 (FIG. 4(C)) is unnecessary at the portion where the laser diode 21 is later formed. The zinc diffused region 42 is therefore formed only at the portion which will later become the photodetector 22. The zinc diffused region 42 is preferably formed throughout the width of the monolithic semiconductor crystal in the $<01\overline{1}>$ direction. The zinc diffused region 42 should have diffusion fronts in the respective portions of the p-type current blocking layer 36 in order to use the outside parts of the operative layer 32 as parts of the carrier generating region 29 of the photodetector 22.

The ohmic electrodes 43 and 44 and the etched groove are formed as in the semiconductor devices illustrated with reference to FIGS. 2 through 9. Inasmuch as the semiconductor layers 31 through 33 are parallel to the $<011>$ direction after etch of the channels, abnormal growth never occurs in the current blocking layers 36 and 37 and the like. It has been confirmed that the yield is further raised.

Figure 12:
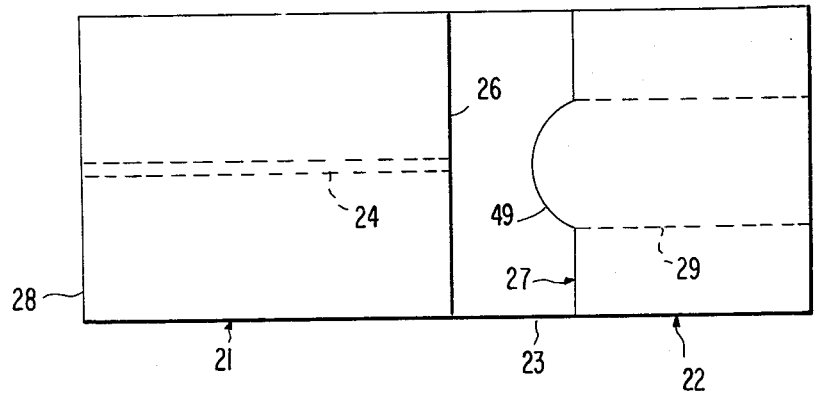
FIG. 12 is a top view of an integrated optical semiconductor device according to a fifth embodiment of this invention.

Finally referring to FIG. 12, an integrated optical semiconductor device according to a fifth embodiment of this invention comprises similar parts designated by like reference numerals. The first etched surface 26 is again perpendicular to the $<011>$ direction. The second etched surface 27 has a convex portion 49 which includes the light receiving end of the carrier generating region 29. The convex portion 49 is such that the light receiving end is nearest to the first light emitting end along a plane which bisets the stripe region 24 perpendicularly of the carrier generating region 29. The configuration of the convex portion 49 directs most of those laser rays away from the first light emitting end which are emitted therethrough and then reflected at the second etched surface 27.

It is preferred that the convex portion 49 be a part of a cylindrical surface having a cylindrical axis perpendicularly of the heterojunctions of the carrier generating region 29. Such a cylindrically convex portion is effective in collecting the optical output of the first light emitting end into the carrier generating region 29. It has been confirmed that the convex portion 49 is effective even when the convex portion 49 has a triangular top view.

While several preferred embodiments of this invention have thus far been described, it will now be readily feasible for one skilled in the art to carry this invention into effect in various other manners. For example, the laser diode 21 may be of the type disclosed in U.S. Pat. No. 4,105,955 issued to Izuo Hayashi et al, assignors to the present assignee. The photodetector 22 may be a phototransistor, an avalanche photodiode (APD), or the like. The groove may have a bottom surface in the buffer layer 31. It is furthermore possible to select the semiconductor materials and the conductivity types thereof with reference to the above-cited Mito et al patent and to the Hayashi et al patent. This applies to the impurity for forming the electrode stripes 41 and 42. Both mirror surfaces may be etched surfaces. It is also possible to combine two or more of the above-described embodiments. For instance, the integrated optical semiconductor device illustrated with reference to FIGS. 10 and 11 may comprise a thinner stripe region 24 and a thicker carrier generating region 29 as described in conjunction with FIGS. 7 and 8.

What is claimed is:

1. An integrated optical semiconductor device comprising a stripe geometry heterojunction laser diode which is integrated with a photodetector on a semiconductor substrate and separated from said photodetector by an etched groove defining first and second etched surfaces, said laser diode having said first etched surface as one of a pair of mirror surfaces and comprising a stripe region which is bounded by a pair of heterojunctions, has a light emitting end on said first etched surface and a stripe axis, and is made of a semiconductor material having a first band gap, said photodetector having said second etched surface and comprising a carrier generating region which is bounded by a pair of heterojunctions disposed parallel to the heterojunctions of said stripe region, has a light receiving end on said second etched surface and a region axis substantially coaxially of said stripe axis, and is made of a semiconductor material having a second band gap, wherein said second band gap is not wider than said first band gap, said light receiving end having a wider area than said light emitting end.

2. An integrated optical semiconductor device as claimed in claim 1, wherein the heterojunctions of said stripe region are substantially coplanar with the respective heterojunctions of said carrier generating region, said light emitting end having a smaller dimension than said light receiving end in a direction parallel to the heterojunctions of said stripe region and of said carrier generating region.

3. An integrated optical semiconductor device as claimed in claim 2, wherein said first band gap is equal to said second band gap.

4. An integrated optical semiconductor device as claimed in claim 3, wherein the dimension of said light emitting end is about 2 to 3 microns, the dimension of said light receiving end is about 50 to 100 microns.

5. An integrated optical semiconductor device as claimed in claim 1, wherein the heterojunctions of said carrier generating region have a greater distance therebetween than the heterojunctions of said stripe region, said light emitting end having a smaller dimension than said light receiving end in a direction parallel to the heterojunctions of said stripe region and of said carrier generating region.

6. An integrated optical semiconductor device as claimed in claim 5, wherein said second band gap is narrower than said first band gap.

7. An integrated optical semiconductor device as claimed in claim 6, wherein the distance between the heterojunctions of said stripe region is about 0.2 micron, the distance between the heterojunctions of said carrier generating region being about 2 microns, the dimension of said light emitting end being about 2 to 3 microns, the dimension of said light receiving end being about 50 to 100 microns.

8. An integrated optical semiconductor device as claimed in claim 1, wherein said stripe region is bounded by a pair of semiconductor regions which have a common band gap wider than said first band gap and each of which extends between said mirror surfaces and between the heterojunctions of said stripe region, said photodetector comprising those extensions of said semiconductor regions, each of which has a region end on said second etched surface, said region ends dividing said light receiving end into three parts.

9. An integrated optical semiconductor device as claimed in claim 8, wherein the heterojunctions of said stripe region are substantially coplanar with the respective heterojunctions of said carrier generating region, said first band gap being equal to said second band gap.

10. An integrated optical semiconductor device as claimed in claim 9, wherein said stripe region is about 2 to 3 microns wide between said semiconductor regions.

11. An integrated optical semiconductor device as claimed in any one of claims 1 through 10, wherein said laser diode is a buried stripe geometry heterojunction laser diode.

12. An integrated optical semiconductor device as claimed in any one of claims 1 through 10, wherein said light receiving end is not parallel to said light emitting end.

13. An integrated optical semiconductor device as claimed in claim 12, wherein said light receiving end is nearest to said light emitting end along a plane which bisects said stripe region perpendicularly of the heterojunctions of said stripe region and of said carrier generating region.

14. An integrated optical semiconductor device as claimed in claim 13, wherein said light receiving end is a part of a cylindrical surface having an axis perpendicularly of the heterojunctions of said carrier generating region.

* * * * *

UNITED STATES PATENT AND TRADEMARK OFFICE
CERTIFICATE OF CORRECTION

PATENT NO. : 4,470,143
DATED : Sep. 4, 1984
INVENTOR(S) : Mitsuhiro KITAMURA; Kohroh KOBAYASHI; Shigetoki SUGIMOTO It is certified that error appears in the above-identified patent and that said Letters Patent is hereby corrected as shown below:

Column 1, line 17, "stadily" should be --steadily--.

Column 4, line 57, "arsenic" should be --arsenide--;

line 68, "etchent" should be --etchant--.

Column 7, line 53, "arsenic" should be --arsenide--.

Column 8, line 6, "arsenic phosphorus" should be --arsenide phosphide--.

Signed and Sealed this

Second Day of April 1985

[SEAL]

Attest:

DONALD J. QUIGG

Attesting Officer    Acting Commissioner of Patents and Trademarks